US009291758B2

(12) United States Patent
Cao et al.

(10) Patent No.: US 9,291,758 B2
(45) Date of Patent: Mar. 22, 2016

(54) LATERALLY ALIGNED COLLOIDAL NANORODS ASSEMBLIES

(71) Applicant: UNIVERSITY OF FLORIDA RESEARCH FOUNDATION, INC., Gainesville, FL (US)

(72) Inventors: Yunwei Charles Cao, Gainesville, FL (US); Tie Wang, Gainesville, FL (US); Xirui Wang, Gainesville, FL (US)

(73) Assignee: UNIVERSITY OF FLORIDA RESEARCH FOUNDATION, INC., Gainesville, FL (US)

( * ) Notice: Subject to any disclaimer, the term of this patent is extended or adjusted under 35 U.S.C. 154(b) by 212 days.

(21) Appl. No.: 14/107,148

(22) Filed: Dec. 16, 2013

(65) Prior Publication Data

US 2014/0319563 A1    Oct. 30, 2014

Related U.S. Application Data

(63) Continuation-in-part of application No. PCT/US2012/042958, filed on Jun. 18, 2012.

(60) Provisional application No. 61/498,232, filed on Jun. 17, 2011.

(51) Int. Cl.
  *F21V 9/14*    (2006.01)
  *G02B 5/30*    (2006.01)
  (Continued)

(52) U.S. Cl.
  CPC . *G02B 5/30* (2013.01); *B82Y 30/00* (2013.01); *C08K 7/02* (2013.01); *C09K 11/565* (2013.01); *C09K 11/883* (2013.01); *H01L 33/58* (2013.01); *H01L 33/44* (2013.01); *H01L 33/50* (2013.01); *Y10T 428/298* (2015.01)

(58) Field of Classification Search
  USPC ............ 156/230; 252/585; 257/98; 264/1.34; 427/163.1; 428/401
  See application file for complete search history.

(56) References Cited

U.S. PATENT DOCUMENTS 7,225,082 B1    5/2007    Natan et al.
2010/0028543 A1    2/2010    Davis et al.
2010/0264403 A1    10/2010    Sirringhaus et al.

FOREIGN PATENT DOCUMENTS

WO    WO 2009-026141    2/2009
WO    WO 2010/036289 A2 *    4/2010

OTHER PUBLICATIONS

Carbone, L. et al., "Synthesis and Micrometer-Scale Assembly of Colloidal CdSe/CdS Nanorods Prepared by a Seeded Growth Approach," *Nano Letters*, 2007, pp. 2942-2950, vol. 7, No. 10.

(Continued)

*Primary Examiner* — Bijan Ahvazi
(74) *Attorney, Agent, or Firm* — Saliwanchik, Lloyd & Eisenschenk

(57) ABSTRACT

Nanorods assemblies that have lengths in excess of 50 microns to meters are formed from contacting rice-shaped colloidal superparticles that are aligned along the long axis of the colloidal superparticles. The rice-shaped colloidal superparticles are formed from a multiplicity of nanorods with a high degree of association that is end to end to form colloidal superparticles that are in excess of three microns in length and have a length to diameter ratio of about three or more. Methods of preparing the rice-shaped colloidal superparticles employ mixing with an additional ligand to the nanorods to bias the self assembly of the nanorods by solvophobic interactions. Methods of preparing the nanorods assemblies include the infusion of the rice-shaped colloidal superparticles into microchannels patterned on a substrate, wherein the rice-shaped colloidal superparticles' long axes align in the microchannels.

19 Claims, 12 Drawing Sheets

| (51) | Int. Cl. | |
|---|---|---|
| | G02C 7/12 | (2006.01) |
| | C08K 7/02 | (2006.01) |
| | B82Y 30/00 | (2011.01) |
| | H01L 33/58 | (2010.01) |
| | C09K 11/56 | (2006.01) |
| | C09K 11/88 | (2006.01) |
| | H01L 33/00 | (2010.01) |
| | H01L 33/44 | (2010.01) |
| | H01L 33/50 | (2010.01) |

(56) References Cited

OTHER PUBLICATIONS

Rizzo, A. et al., "Polarized Light Emitting Diode by Long-Range Nanorod Self-Assembling on a Water Surface," *ACS Nano*, 2009, pp. 1506-1512, vol. 3, No. 6.

Zhuang, J. et al., "Cylindrical Superparticles from Semiconductor Nanorods," *J. Am. Chem. Soc.*, 2009, pp. 6084-6085, vol. 131.

* cited by examiner

LATERALLY ALIGNED COLLOIDAL NANORODS ASSEMBLIES

CROSS-REFERENCE TO RELATED APPLICATION

The present application is a continuation-in-part of International Patent Application No. PCT/US2012/042958, filed Jun. 18, 2012, which claims the benefit of U.S. Provisional Application Ser. No. 61/498,232, filed Jun. 17, 2011, the disclosures of which are incorporated by reference herein in their entirety, including any figures, tables, or drawings.

The subject invention was made with government support under Contract No. N00014-09-1-0441 awarded by the Office of Naval Research, and contract No. DMR1309798 award by the National Science Foundation. The government has certain rights to this invention.

BACKGROUND OF INVENTION

Nanorods are anisotropic nanocrystals having a long axis and a short axis. The nanorod's structural anisotropy gives rise to anisotropic physical characteristics, displaying polarized optical, electronic, magnetic, and electric properties at the nanometer scale. An ability to assemble these nanorods into ordered assemblies with sizes that range from the microscopic to the macroscopic scale is critical for development of devices and applications based on the anisotropic physical properties. The dimensions of the ordered nanorods assemblies limit the size of nanorod-based devices. The degree of order in a nanorods assembly further determines the overall quality of a device. These nanorods-based devices include solar cells, photodetectors, lasers, and polarized light emitting devices (LED). Specifically, polarized LEDs permit decreased energy requirements and improved contrast, particularly during daytime use, when used in display applications.

The construction of nanorod-based LEDs requires lateral alignment of colloidal nanorods on a larger area surface. To date, several techniques have been used to laterally align colloidal nanorods, including: Langmuir-Blodgett techniques; external electric field alignment; imposing interfacial tension between two immiscible liquid phases; stretching a nanorods filled polymer composite; and transferring nanorods assemblies from a water-air interface with a poly(dimethylsiloxane) (PDMS) stamp pad. However, these techniques have not resulted in large-sized nanorods assemblies, but only those with dimensions of only a few micrometers when there is a high degree of order. Presently, for example, the maximum polarization ratio for an LED constructed from a colloidal CdSe/CdS nanorods assembly is about 0.34, as disclosed in Rizzo, A. et al. "Polarized Light Emitting Diode by Long-Range Nanorod Self-Assembling on a Water Surface" *Acs Nano* 3, 1506-12, (2009). The polarization ratio of 0.34 is much smaller than that of a single CdSe/CdS nanorod (0.75), which suggests that CdSe/CdS nanorods were not well laterally aligned in the nanorods assembly of the LED.

Hence there remains a need to achieve a nanorods assembly that can be prepared with large dimensions and have good lateral alignment of the nanorods. Achievement of such well aligned nanorods assemblies could permit construction of large scale polarized LEDs and other devices with polarization ratios approaching or exceeding the polarization ratio of the individual nanorods that form the assembly.

BRIEF SUMMARY

Embodiments of the invention are directed to large nanorod assemblies that display a polarization ratio equal to or greater than that of the nanorods that comprise the assembly. The nanorods assembly includes a multiplicity of contacting rice-shaped colloidal superparticles, aligned along the long axes of the rice-shaped colloidal superparticles, having a length in excess of three microns and a length to diameter ratio in excess of three. The colloidal superparticles have a multiplicity of nanorods aligned along the long axis of the rice-shaped colloidal superparticles. The length of the nanorods assembly is in excess of about 50 microns and the diameter perpendicular to the length of the nanorods assembly is less than the average colloidal superparticle's long axis. The nanorod assembly can be 50 microns or more in length and can be prepared to have centimeter or even meter long nanorods assembly.

Another embodiment of the invention is directed to polarizing photonic sheets, where a substrate has a plurality of nanorods assemblies embedded within or resting upon the substrate. The substrate can be any inorganic or organic insulator, semiconductor or conductor. Another embodiment of the invention is to a down-conversion device, where one or more polarizing photonic sheet includes one or more light emitting diodes (LEDs).

Another embodiment of the invention is directed to a method of forming the rice-shaped colloidal superparticles that involves combining an additional ligand with a first solution of nanorods, where the nanorods include one or more ligands, to form a second solution. To this second solution is added an aqueous surfactant solution, where upon removing some or all of the solvent from the first solution of nanorods, a second aqueous solution is formed. By injecting the second aqueous solution into a water miscible solvent, colloidal superparticles form with the rice-shape that is appropriate for formation of the nanorods assemblies.

Another embodiment of the invention is directed to a method of preparing a nanorods assembly, where a suspension of rice-shaped colloidal superparticles in a liquid is deposited on the surface of a substrate that has one or more microchannels having a cross-section smaller than the average rice-shaped colloidal superparticle's long axis. The rice-shaped colloidal superparticles infiltrate the microchannels, which aligns rice-shaped colloidal superparticles with continuous contact between the colloidal superparticles. Upon removal of some or all of the liquid, a stable nanorods assembly forms.

DETAILED DISCLOSURE

Embodiments of the invention are directed to a novel method of laterally aligning rice-shaped colloidal superparticles into nanorods assemblies to form thin films having nanorods assemblies with dimensions that can exceed a centimeter. Embodiments of the invention are directed to the nanorods assemblies, which have high polarization ratios and can be used for LED and other photonic devices. The nanorods assemblies comprise a plurality of contacting rice-shaped colloidal superparticles that comprise a multiplicity of well-aligned nanorods into an organized and crystalline superlattice. A colloidal superparticle includes an aggregate of aligned nanorods. The individual nanorods are nanoparticles having a large aspect ratio (e.g., length/radius >2) with a long dimension of about 0.010 to 50 microns and a radius of 1-100 nanometers, where a multiplicity of the nanoparticles associate, generally with the aid of a surfactant, through non-covalent interactions into a superparticle. The rice-shaped colloidal superparticles, according to an embodiment of the invention, have a superlattice structure of the combined nanorods, and have length of 0.5 microns to about 100 microns that are sub-micron or micron in one dimension, the diameter, for example, about 0.02 microns to about 1 micron, and are multi-micron in a perpendicular dimension, the length, for example, greater than 3 microns.

Figure 1:
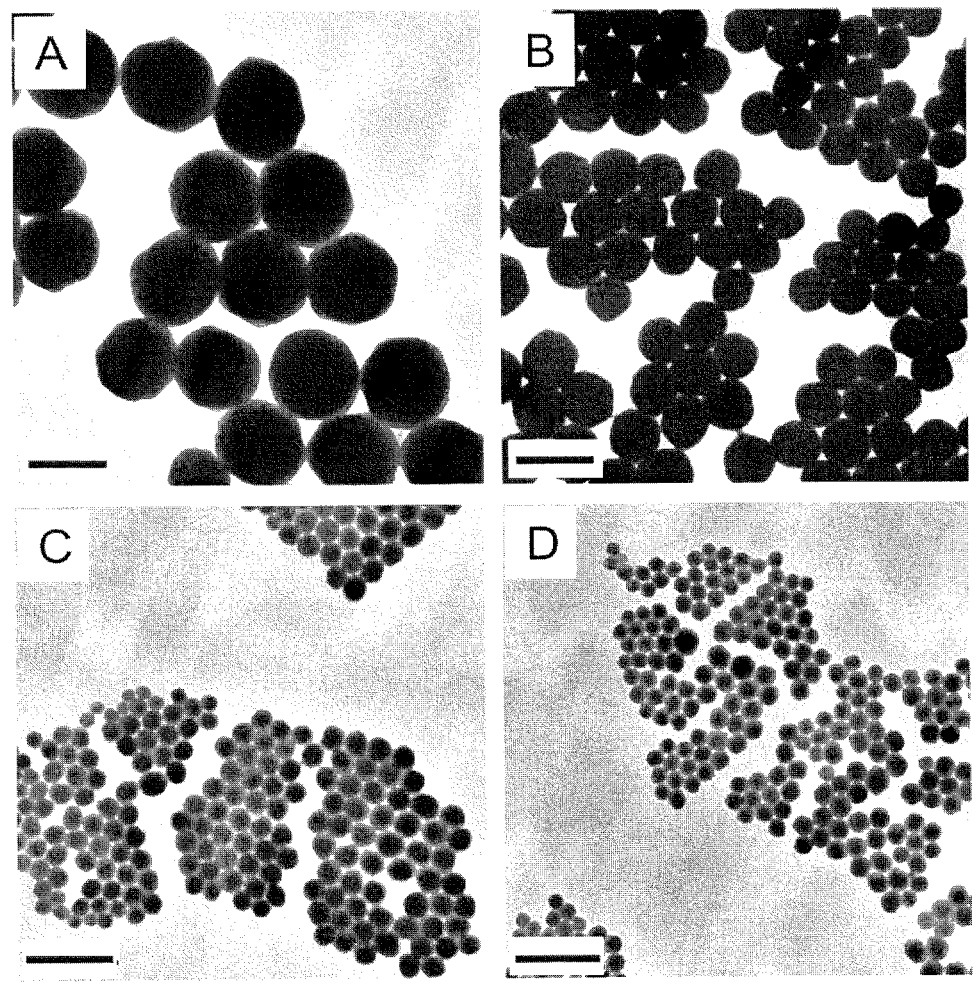
FIG. 1 shows TEM images of prior art colloidal superparticles from 31 nm CdSe/CdS nanorods with sizes depending on the surfactant as a function of the dodecyl trimethylammonium bromide (DTAB) concentration used in their preparation, with diameter of 1100 nm (A), 650 nm (B), 250 nm (C), and 180 nm (D) from solutions having DTAB concentrations of 5, 10, 20 and 30 mg/mL, respectively, and where scale bars are 1 μm.
Figure 2:
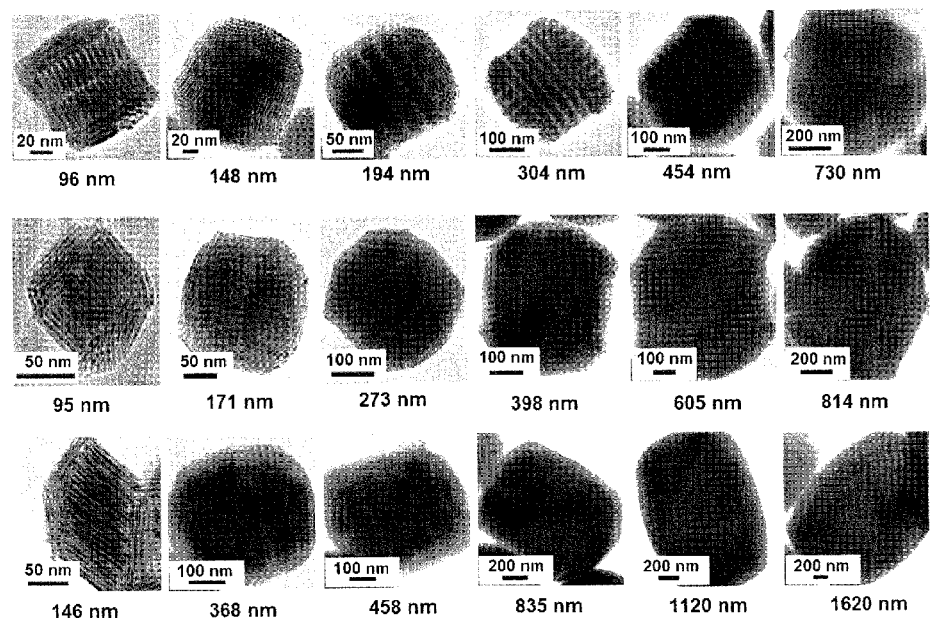
FIG. 2 shows high magnification TEM images of prior art colloidal superparticles of different sizes from (top row) 31-nm CdSe/CdS nanorods, (middle row) 45-nm CdSe/CdS nanorods, and (bottom row) 78 nm CdSe/CdS nanorods.

Colloidal superparticles and a method of their preparation are described in Cao et al. "Supercrystalline Colloidal Particles and Methods of Production" WO 2009/026141, Feb. 26, 2009. Colloidal superparticle synthesis, as taught in WO 2009/026141, involves two steps. The first step is the mixing of a first solution of hydrophobic ligand-functionalized nanorods with an aqueous surfactant to form a second solution of nanorods-micelles, typically after removal of the solvent for the first solution when forming the second solution. In a second step, the second solution is mixed with a solvent to form a third solution of colloidal superparticles made of nanorods where a solvophobic effect promotes aggregation of the nanorods into colloidal superparticles. Although the size of the colloidal superparticles can be controlled by the proportions of the surfactant and nanorods employed, as can be seen in FIG. 1, the shapes were not affected as significantly. Non-spherical colloidal superparticles had relatively small length to diameter ratios, generally less than 2 as can be seen in FIG. 2, where the ultimate length of the colloidal superparticle is typically larger for those containing larger nanorods.

Figure 3:
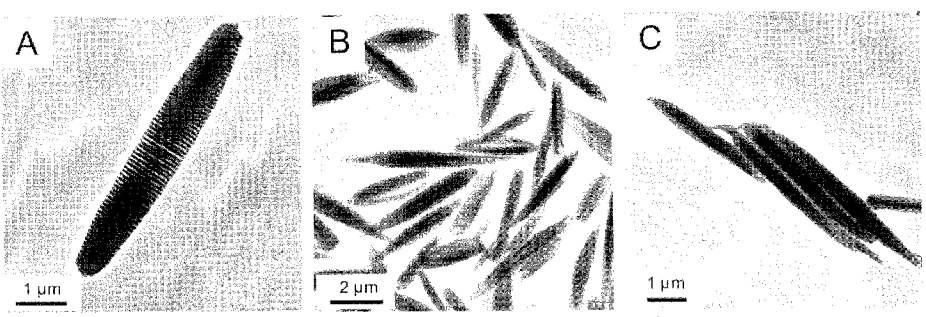
FIG. 3 shows various TEM images of CdSe/CdS rice-shaped colloidal superparticles at various magnifications from an unaligned suspension showing (A) a single colloidal superparticle having a length of about 6 μm and a diameter of about 1 μm from a multiplicity of nanorods having a diameter of about 78 nm, (B) randomly oriented colloidal superparticles, and (C) a nanorods assembly-like aggregate of colloidal superparticles of about 8 μm in length having an average length of about 5 µm and a diameter of about 0.5 µm aligned to have nearly parallel long axes, where the magnification varies as indicated in the scale bars.

According to an embodiment of the invention, it was discovered that by tuning the density of hydrophobic ligands on the nanorods with two or more ligands of different structures, the self-assembly of nanorods into colloidal superparticles can be modified to form rice-shaped colloidal superparticles. In these rice-shaped colloidal superparticles, nanorods are aligned along the long axis of the superparticles to a large extent, by controlling the proportions of the two ligands attached to the nanorods. These rice-shaped colloidal superparticles appear as elongated ovoids having a quasi-cylindrical shape with a long axis in excess of about three micrometers and length to diameter ratios in excess of about three, and as great as about ten. As can be seen in FIG. 3, there is some taper to the ends of the apparent ovoids.

Figure 4:
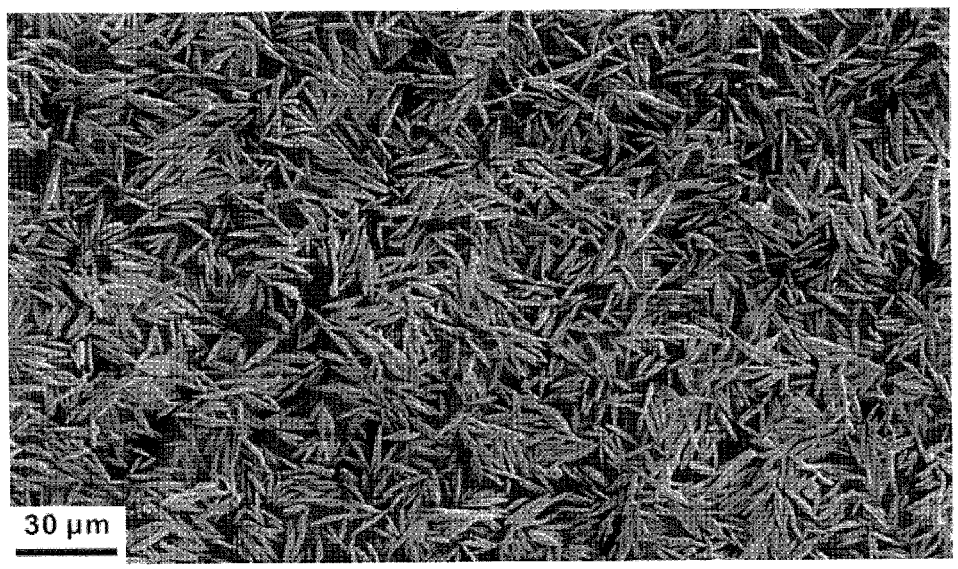
FIG. 4 shows a scanning electron microscope (SEM) image of needle-like superparticles, according to an embodiment of the invention.
Figure 5:
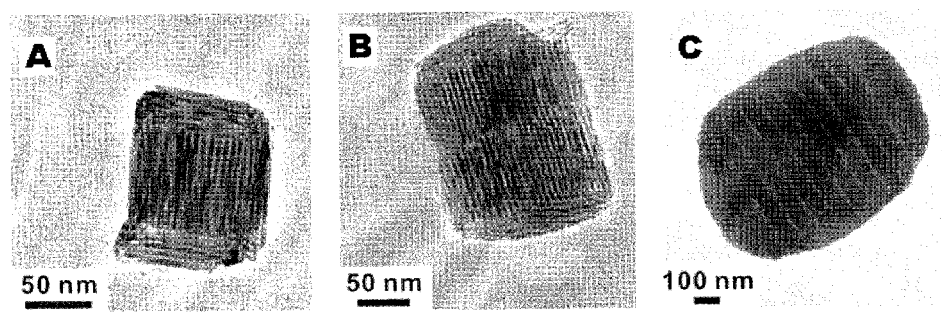
FIG. 5 shows TEM images of prior art superparticles, A, B and C observed from nanorods of l=78.0±2.1 nm and d=5.4±0.3 nm.

In an exemplary embodiment, after incubation with octylamine (1 µL) for six days under Ar, CdSe/CdS nanorods (1=78.0±2.1 nm and d=5.4±0.3 nm, 10 mg) appear to be a precursor for superparticle synthesis that is capable of reproducibly leading to the formation of single-domain, elongated needle-like superparticles with a length of 11±4 µm and a diameter of 1.1±0.3 µm as is shown in FIG. 3A and FIG. 4. These single-domain superparticles have a significantly different morphology from those multi-domain superparticles made from identical nanorods without incubation treatment as shown in FIG. 5.

Figure 17:
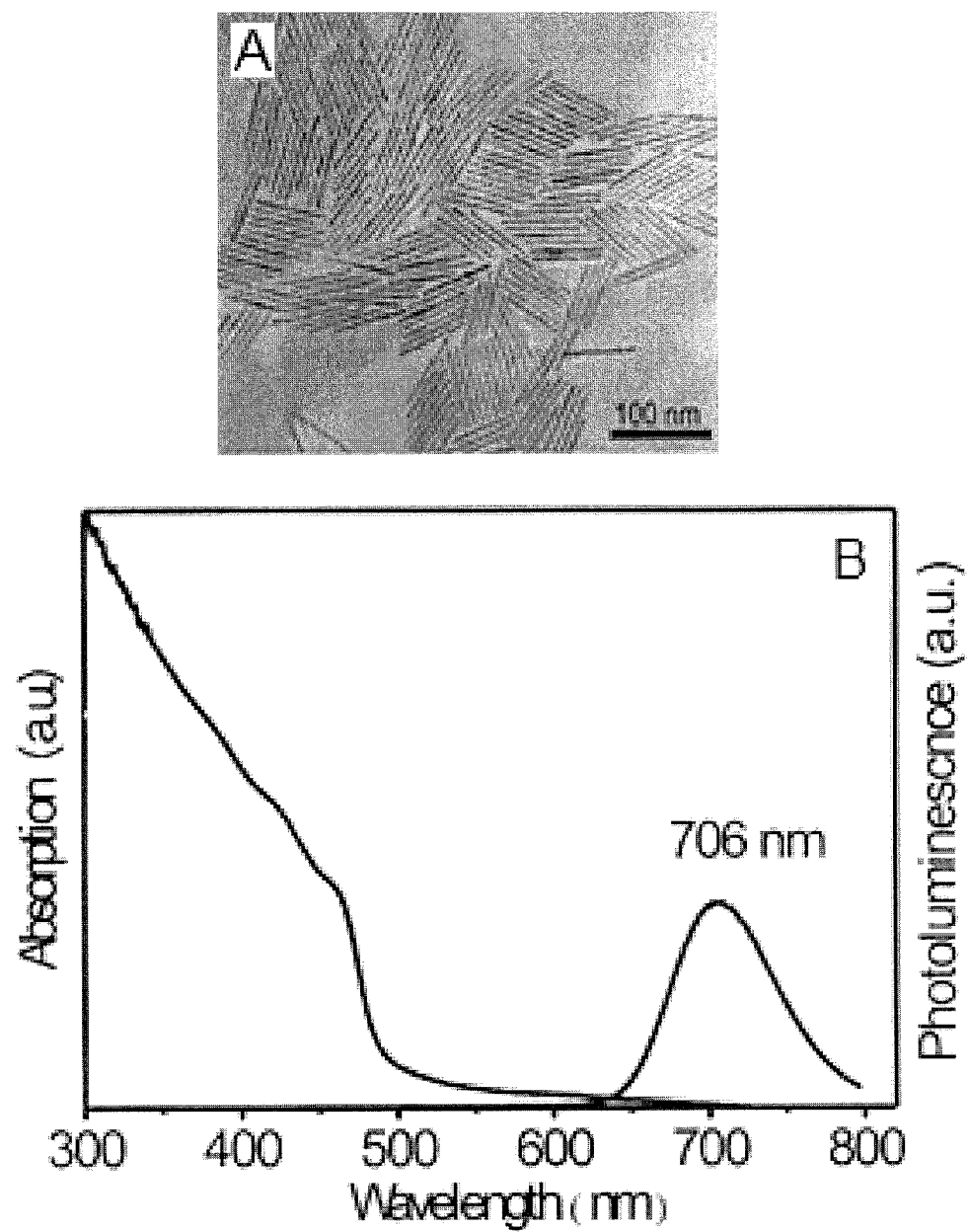
FIG. 17 shows (A) a TEM image of CdSe:Te/CdS core/shell nanorods having a length of 75 nm and a diameter of 4.6 nm with about 4.6% Te in the CdSe:Te core particles, and (B) absorption and photoluminescence spectra of CdSe:Te/CdS nanorods.

The nanorods comprise: an inorganic compound comprising a metal and a first ligand. The inorganic compound comprising a metal can be Au, Ag, Cu, Fe, Co, Ni, transition metal oxide, indium oxide, gallium oxide, CdSe, CdS, CdTe, ZnS, ZnSe, ZnTe, HgS, HgSe, HgTe, InP, InAs, GaP, GaAs, PbS, PbSe, PbTe, InCuS, InCuSe, InAgS, InAgSe, or InAgTe. The inorganic compound comprising a metal can be a core-shell semiconductor nanoparticles, such as CdSe/CdS, CdSe:Te/CdS, or Mn-doped CdSe/CdS. For example, nanorods of CdSe:Te/CdS, as shown in FIG. 17A, have been prepared with a length of 75 nm and a diameter of 4.6 nm where there is about 4.6% Te in the CdSe:Te core which provides photoluminescence at 706 nm, as indicated in FIG. 17B. The first ligand or ligands include, for example, fatty acids, alcohols, thiols, phosphines, and phosphonic acids, which are present during the preparation of the nanorods. The second or additional ligand is added after the formation of the nanorods to asymmetrically modify the nanorods in a manner that directs the self-organization of the nanorods while forming the colloidal superparticles.

Figure 6:
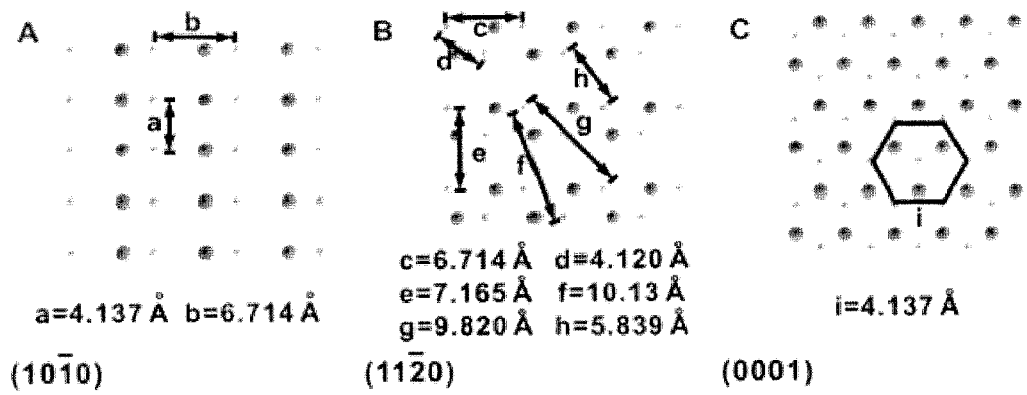
FIG. 6 shows schemes of the atomic packing structures of a CdS crystal at (A) the $\{10\bar{1}0\}$, (B) the $\{11\bar{2}0\}$, and (C) $\{0001\}$ faces, where Cd atoms are indicated by small lighter balls and S atoms are indicated by larger darker balls, and where characteristic inter-atom distances are labeled in each image, where the differences in the faces promote the superparticle formation according to an embodiment of the invention.
Figure 7:
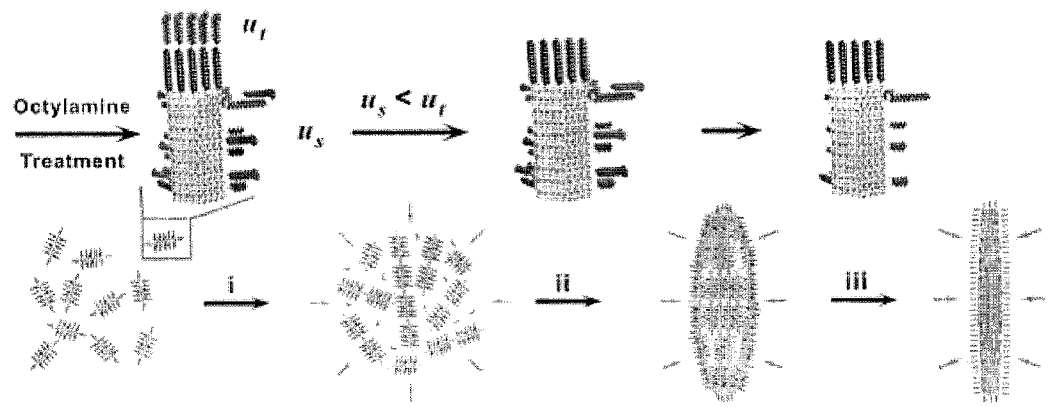
FIG. 7 shows a scheme for superparticle formation under non-equilibrium conditions, where the dissociation rate of DTAB from the side surfaces ($u_s$) is smaller than that from top or bottom faces ($u_t$) resulting in higher solvophobicity of the top face over the side faces, which is a "kinetic functional anisotropy," that leads to rapid growth of supercrystalline domains along the long axes of constituent nanorods and the formation of rice-shape superparticles, according to an embodiment of the invention, where the growth process involves: (i) Embryo formation, (ii) colloidal crystallization under non-equilibrium conditions, and (iii) ultimate rice-shape superparticle formation.

Not to be bound by theory, the formation of the rice-shaped colloidal superparticles is consistent with a controlled amount of at least one additional ligand, for example, octylamine, hexylamine, decylamine, octanethiol, or trioctyl phosphine, added to the first solution, resulting in nanorod-micelles that exhibit a higher ligand density on the nanorod-micelle's tips than on the nanorod-micelle's sidewall. In an exemplary embodiment, the surface of CdSe/CdS nanorods exhibit atomic packing factor anisotropy, promoting their bottom and top $\{0001\}$ faces to have a higher ligand packing density than do the nanorods' side faces, such as $\{10\bar{1}0\}$ and $\{11\bar{2}0\}$, as illustrated in FIG. 6. Therefore, appropriately functionalized nanorods permit the intercalation of DTAB hydrocarbon chains into the surface ligand layer residing on the side faces but not on the bottom and top faces of CdSe/CdS nanocrystals. The nature and density of the ligand at the nanorod-micelle's tips promote more rapid surfactant decomposition at a nanorod-micelle's tips than surfactant decomposition from the nanorod-micelle's sidewall. As a result, the tips of nanorod-micelles exhibit a slightly higher hydrophobicity than their sidewall during the formation of nanorod superparticles. This higher hydrophobicity at the nanorod-micelle's tip, promotes preferential stacking of nanorod tip on nanorod tip to form elongated rice-shaped superparticles, as shown in FIG. 7. In contrast, where hydrophobicity at the tip is effectively equal to that of sidewall, the nanorods prefer to form assemblies, as shown in FIG. 8, to yield superparticles as those shown in FIG. 2.

Figure 8:
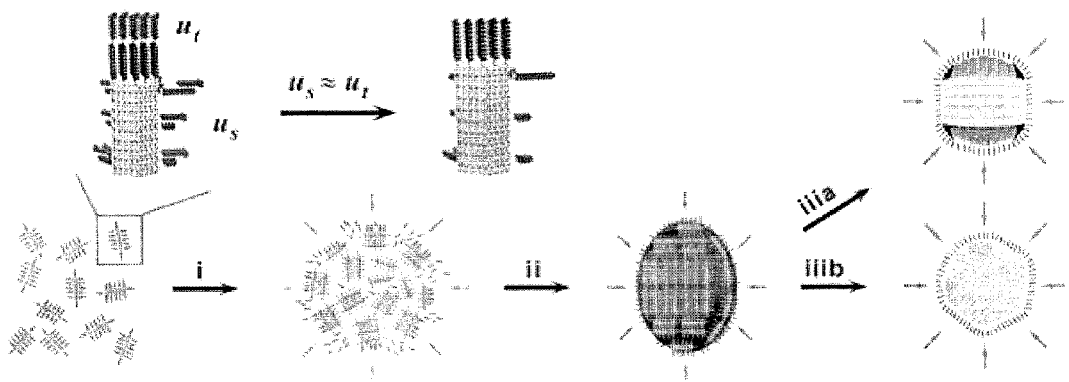
FIG. 8 shows a scheme for superparticle formation under equilibrium conditions, not of the invention, where during nanorod-micelle decomposition, the leaving rates of DTAB from the side surface ($u_s$) is similar to that from top or bottom faces ($u_t$), which results in nanorods with isotropic hydrophobicity, where the process involves (i) Embryo formation, (ii) colloidal crystallization, (iiia) DDC formation, and (iiib) IMP formation.

FIG. 8 shows a scheme of superparticle formation at equilibrium conditions that results in more spherical particles, not of the invention, where during nanorod-micelle decomposition, the leaving rates of DTAB from the side surface ($u_s$) is nearly equal to that from top or bottom faces ($u_t$). This process results in nanorods with isotropic hydrophobicity, allowing colloidal crystallization of nanorods under an equilibrium condition. (i) Embryo formation, (ii) colloidal crystallization at an equilibrium condition, (iiia) DDC formation, and (iiib) IMP formation Exemplary rice-shaped colloidal superparticles formed from CdSe/CdS nanorods, which are core-shell semiconductor nanoparticles, are shown in FIG. 3. FIG. 3A shows a high magnification image of a single colloidal superparticle within a mixture of randomly oriented and associated colloidal superparticles as shown in FIG. 3B. FIG. 3C shows an assembly-like aggregate of apparently four contacting colloidal superparticles with an overall length of about 8 µm that randomly formed within the mixture of randomly oriented and associated colloidal superparticles. The nanorods assemblies, according to embodiments of the invention, are formed by a method that achieves nanorods assemblies with lengths that are in excess of about 100 microns, or more than 10 times that of the assembly-like aggregate shown in FIG. 3C.

Figure 9:
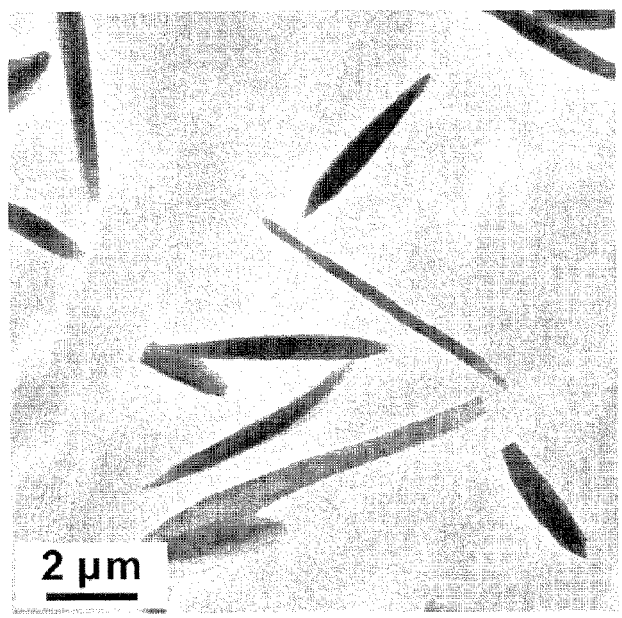
FIG. 9 shows a TEM image of very thin rice-shape superparticles formed in the presence of 1,12-dodecanediamine, according to an embodiment of the invention.
Figure 10:
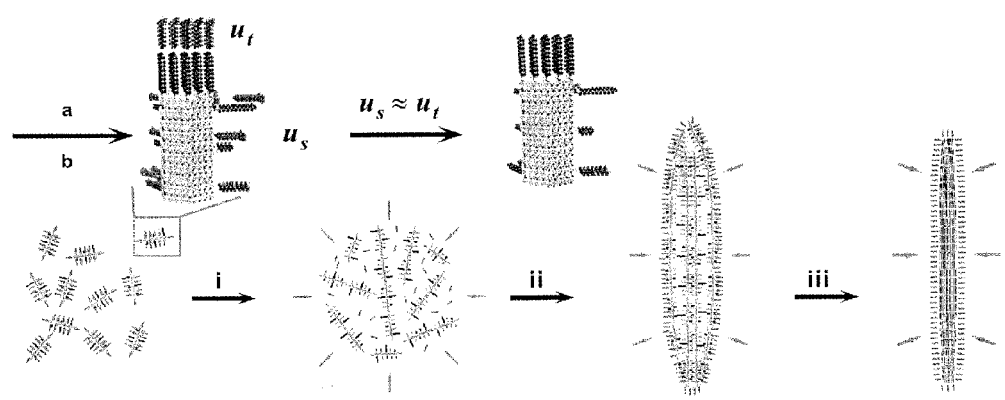
FIG. 10 shows a scheme for superparticle formation in the presence of 1,12-dodecanediamine, where the dissociation rates of DTAB are similar for the side surfaces ($u_s$) and the top or bottom faces ($u_t$), where strong absorption of 1,12-dodecanediamine on the sides induces the top and bottom of the nanorods to have higher solvophobicity than the side faces during decomposition of nanorod micelles, which results in a rapid growth of supercrystalline domains along the long axes of constituent nanorods and the formation of rice-shape superparticles, according to an embodiment of the invention, where the process involves (i) Embryo formation, (ii) colloidal crystallization under non-equilibrium conditions, and (iii) rice-shape superparticle formation.

In another embodiment of the invention an additional ligand, a bidentate ligand, such as 1,12-dodecanediamine, is included which further reduce the hydrophobicity on the sidewall, resulting in a further thinning of the rice-shaped superparticles in excess of that observed absent the bidentate ligand, as shown in FIG. 9 and FIG. 10, for a scheme of formation of the very thin superparticles.

Figure 11:
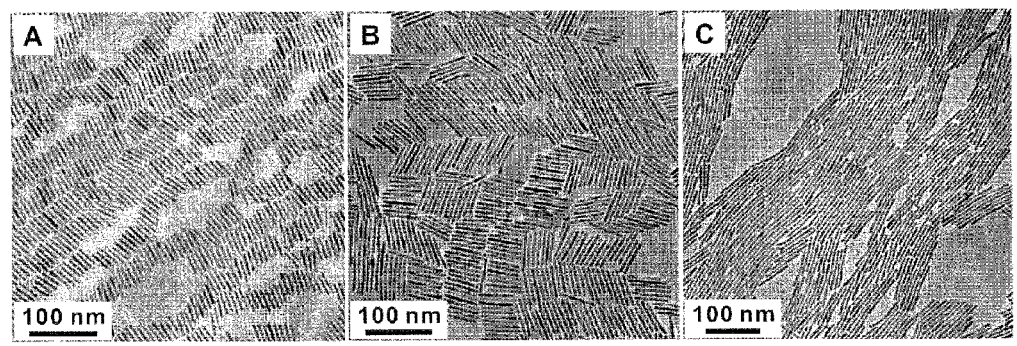
FIG. 11 shows TEM images of (A) 31 nm, (B) 45 nm and (C) 78 nm CdSe/CdS nanorods.
Figure 12:
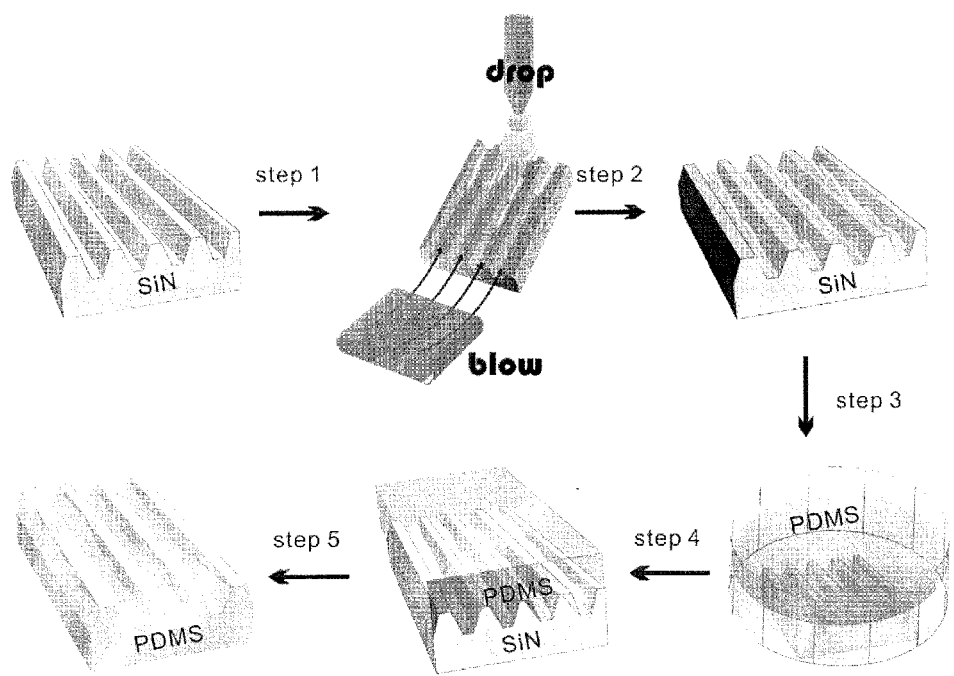
FIG. 12 shows a schematic for forming nanorods assemblies according to an embodiment of the invention where CdSe/CdS nanorod colloidal superparticles are imbedded in a PDMS network substrate at the tops of parallel features.
Figure 13:
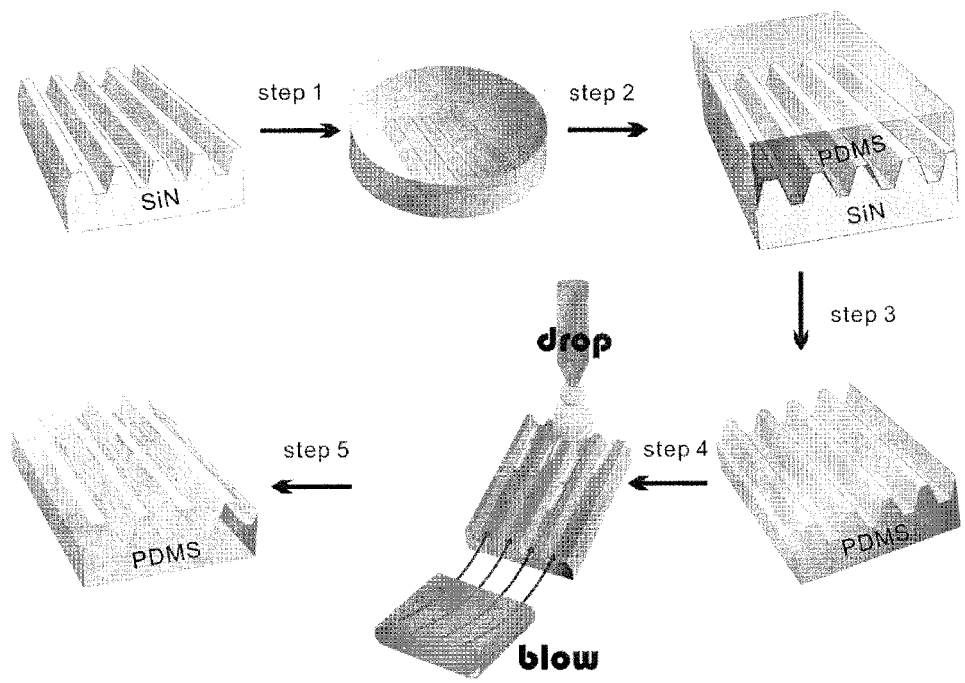
FIG. 13 shows a schematic for forming nanorods assemblies according to an embodiment of the invention where CdSe/CdS nanorod colloidal superparticles are deposited on the base of parallel microchannels in a PDMS network substrate.
Figure 14:
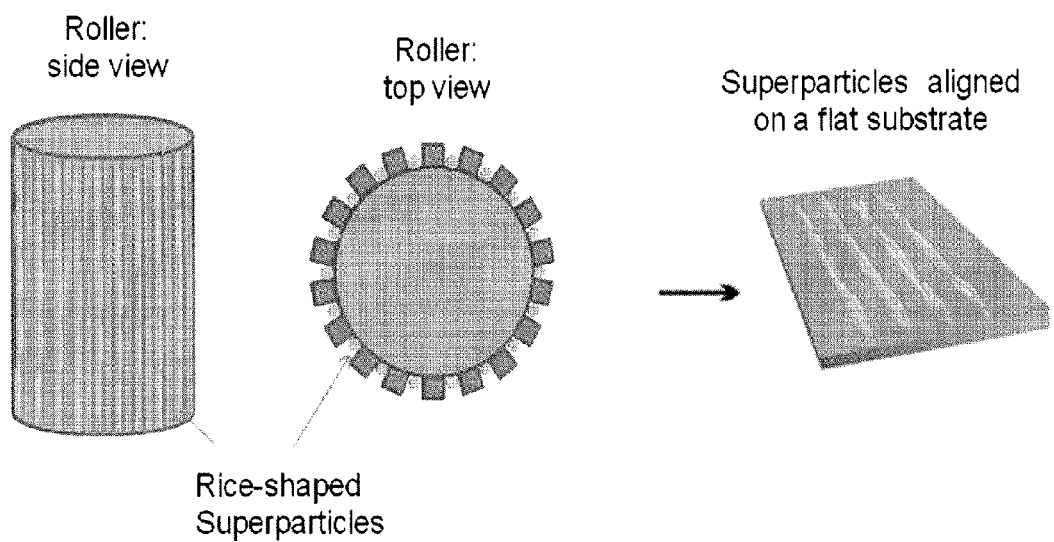
FIG. 14 shows a schematic for roll-to-roll printing process to deposit nanorods assemblies according to an embodiment of the invention with lateral alignment on a flat substrate.
Figure 15:
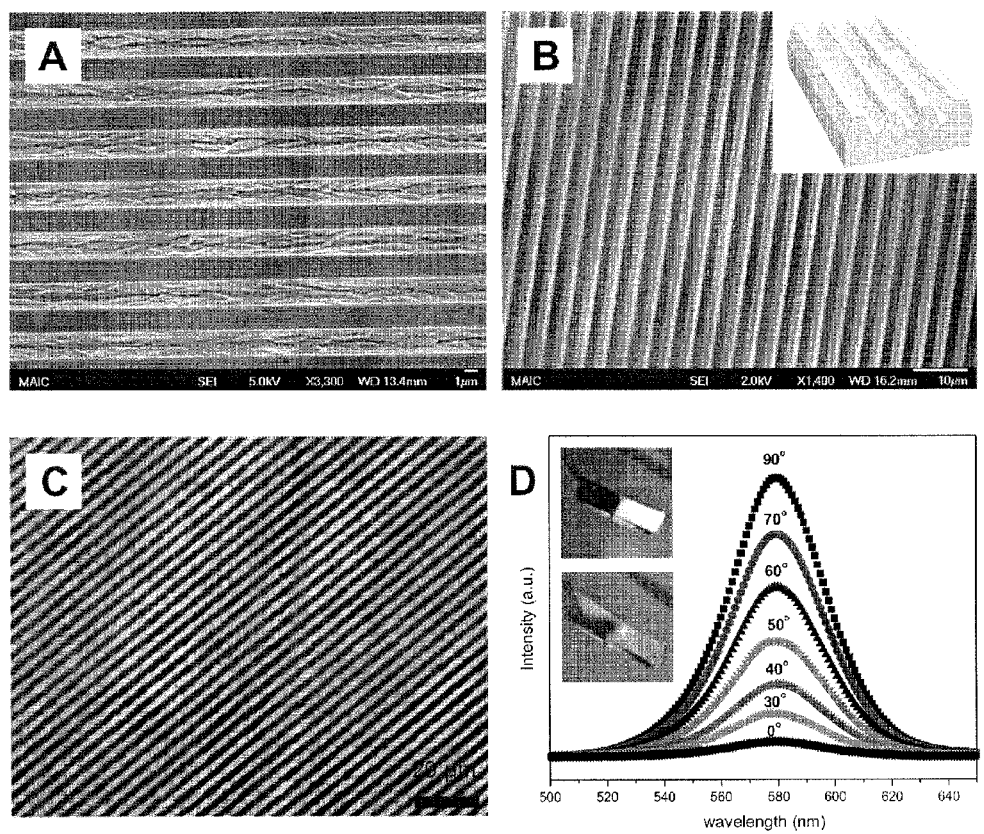
FIG. 15 shows: (A) a SEM image of nanorods assemblies of rice-shaped colloidal superparticles laterally aligned on a $Si_3N_4$ substrate according to an embodiment of the invention; (B) a SEM image of a PDMS film with imbedded aligned nanorods assemblies according to an embodiment of the invention; (C) a fluorescence microscope image showing patterns and light emission from the PDMS film; and (D) polarization florescence spectra of the PDMS thin film as a function of polarizer angle, where the insets show photographs of the PDMS film viewed through a polarizer at 0° (top) and 90° (bottom).

According to an embodiment of the invention, a method of preparation of the nanorods assemblies is a bottom-up assembly approach that comprises two steps. In the first step nanorods, as shown in FIG. 11, are assembled into rice-shaped colloidal superparticles with each nanorod building block aligned along the long axis of these rice-shaped colloidal superparticles, as shown in FIG. 3. In a second step, suspended rice-shaped colloidal superparticles are infused and aligned into a patterned substrate having, for example, parallel micrometer-sized channels, or microchannels. Infusion and alignment is flow-assisted, forming the nanorods assemblies. As desired, the nanorods assemblies of aligned contacting rice-shaped colloidal superparticles on this patterned substrate can be employed as initially formed or transferred onto the surface of a second substrate through a molding or contact printing process or a roll-to-roll printing process, as shown in FIGS. 12-14. Although the patterned substrate has microchannels, these microchannels need not be only a series of parallel features as shown in FIGS. 12-15. These microchannels can be of various patterns as long as the microchannels have an appropriate diameter and have a sufficiently small curvature to permit the long axis of the rice-shaped colloidal superparticles to align in the microchannels and be contacted to each other through the entire microchannels' length. The length of the microchannels can vary as desired and the width of the microchannels can vary to a degree such that the width of the microchannel should be less than about the average length of the rice-shaped colloidal superparticles, but larger than the maximum diameter of the rice-shaped colloidal superparticles.

According to embodiments of the invention, the nanorods assemblies are formed when the rice-shaped colloidal superparticles are infused and aligned within the microchannels of a patterned substrate. For many uses of the nanorods assemblies, the patterned substrate is in the form of a sheet, where the sheet comprises a plurality of microchannels. The patterned substrate can be an inorganic substrate, for example, a silicon substrate, $Si_3N_4$ coated silicon substrate (as shown in step 1 of FIG. 12), or a metal, or the patterned substrate can be a polymeric substrate, for example, a cross-linked polydimethylsiloxane (PDMS) (as shown in step 3 of FIG. 12), polyvinyl alcohol (PVA), a thermoplastic, or a thermoset. The patterned substrate can be a conductor, a semiconductor, or an insulator. The method of alignment of the rice-shaped colloidal superparticles involves flow of the suspended rice-shaped colloidal superparticles over the surface having the microchannels, as shown in FIG. 12 and FIG. 13. Generally, but not necessarily, the rice-shaped colloidal superparticles are more dense than the liquid used to suspend them.

During the flow of the suspension over the microchannels, the rice-shaped colloidal superparticles that are approximately aligned with the microchannel, enter and are trapped in the microchannels. Other rice-shaped colloidal superparticles transport further on the surface of the substrate until their orientation is aligned with a microchannel and enters the microchannel at an unoccupied site for entry. The flow can be driven by gravity, as shown in FIG. 12 and FIG. 13, where an edge of the substrate surface is elevated to position the surface at an angle to a plane surface at the base of a system for deposition in the microchannels. The flow can be mechanically induced, for example, by spin casting, or by drawing a roller or doctor blade across the surface with the microchannels, and using an appropriate mechanical down-force that does not damage the rice-shaped colloidal superparticles. After introduction of a sufficient quantity of the suspended rice-shaped colloidal superparticles, the channels have rice-shaped colloidal superparticles infused in the microchannels, forming a continuously contacting assembly of rice-shaped colloidal superparticles as shown in FIG. 12 and FIG. 13.

The residual liquid or any portion of the liquid, from the suspension can be removed from the substrate and nanorods assembly by any method that does not affect the shape and orientation of the nanorods assemblies in a negative, undesired, manner and does not decompose the rice-shaped colloidal superparticles. The liquid removal can occur by devolatilization of a liquid using a gas flow, heating, or evacuation. The liquid removal can employ a solvent or solution that selectively washes a portion of the suspending liquid from the nanorods assembly. The liquid removal can employ contacting the surface with an absorbent material to wick a portion of the suspending liquid from the nanorods assembly formed in the microchannels. The liquid removal can result from the absorption of a portion of the suspending liquid by the substrate material as long as swelling does not occur to an extent that the microchannels cannot retain the nanorods assembly, at least during the period of depositing the rice-shaped colloidal superparticles in the microchannels. As indicated in FIG. 12 and FIG. 13, a gas flow can be employed during the deposition of the rice-shaped colloidal superparticles counter to the flow of the suspension in a continuous manner during introduction of the suspension, with alternate periods to the introduction of the suspension, or after complete addition of the suspension to the surface of the substrate.

By controlling the properties of the rice-shaped colloidal superparticles suspension and using appropriate geometries of the microchannels on the substrate, the rice-shaped colloidal superparticles are well aligned in the microchannels. The shape and length of the microchannels can vary over wide range permitting one to match the patterns, dimensions, and nanorod densities to the application that employs the nanorods assemblies. The length of the microchannels can be a small multiple of the length of the individual rice-shaped colloidal superparticles employed with dimensions of micrometers, for example about 50 microns, to dimensions of multiple millimeters, centimeters, or even meters. The nanorods assemblies can be in excess of 100 microns, in excess of a millimeter, in excess of a centimeter, or in excess of a meter, when the microchannels are of these dimensions.

The nanorods assemblies on the substrate can be transferred into or onto a second substrate through a molding or contact printing process, as shown in FIG. 12. The second substrate can be converted from a liquid to a solid on the surface of the substrate having the microchannels. The fluid can be deposited as: a melt which solidifies as a glassy and/or crystalline material; as a polymerizable monomer and/or macromer mixture which polymerized to a thermoplastic or thermoset; or as a crosslinkable resin, which is gelled to a rubbery state. A sheet having parallel microchannels on a flexible substrate can be rolled into a cylinder with the nanorods assemblies directed to the outer surface of the cylinder and used in a roll-to-roll printing process, as shown in FIG. 14.

The nanorods assemblies on the substrate can be in the form of a sheet with a plurality of nanorods assemblies and can be used as a polarizing photonic device, such as a polarizing LED. Additionally, the polarizing photonic device can comprise materials in addition to the rice-shaped colloidal superparticles that are deposited in the microchannels, simultaneously with or subsequently to the rice-shaped colloidal superparticles. These materials can be Au, Ag, Cu, Fe, Co, Ni, transition metal oxide, indium oxide, gallium oxide, CdSe, CdS, CdTe, ZnS, ZnSe, ZnTe, HgS, HgSe, HgTe, InP, InAs, GaP, GaAs, PbS, PbSe, PbTe, InCuS, InCuSe, InAgS, InAgSe, InAgTe, or any combination thereof. Other uses for the nanorods assemblies include photo-detectors, solar cells, and thermoelectric applications.

Methods and Materials

Chemicals

Trioctylphosphine oxide (TOPO, 99%), Trioctylphosphine (TOP, 97%), Tributylphosphine (TBP, 97%), sulfur (99%), and ethylene glycol (99%) were purchased from Aldrich. Cadmium oxide (CdO, 99.99%), selenium (Se, 200 mesh, 99.99%), and dodecyl trimethylammonium bromide (DTAB, 97%), 1,12-dodecanediamine (98%), 4,9-Dioxa-1,12-dodecanediamine (97%), Dodecanedioic acid (99%), 11-Aminoundecanoic acid (97%) were purchased from Alfa Aesar. Octadecylphosphonic acid (ODPA, 99%), and hexylphosphonic acid (HPA, 99%) were purchased from Polycarbon Inc. Nanopure water (18 MΩcm) was made using a Barnstead Nanopure Diamond system. All the other solvents were purchased from Fisher Scientific International, Inc.

Synthesis of CdSe seeds

A mixture of TOPO (3.0 g), ODPA (0.280 g) and CdO (0.060 g) was prepared in a 50 mL flask, heated to 150° C. and under vacuum for 1 hour. The temperature of the flask was increased to above 300° C. until the CdO dissolved, with the solution turning optically clear and colorless. Under an argon atmosphere, 1.5 g of TOP was injected into the flask. A Se:TOP solution (0.058 g Se+0.360 g TOP) was injected into the flask at a temperature of 370° C. The CdSe dots were grown at 370° C. for multiples of ten seconds, depending on the final desired size. After a reaction time of 15 seconds, CdSe dots with an average diameter of 2.6 nm formed; after 25 seconds, CdSe dots with an average diameter of 2.8 nm formed; and after 50 seconds, CdSe dots with an average diameter of 3.3 nm formed. CdSe dots were purified by three consecutive cycles of precipitation in methanol, followed by redispersion in toluene, and followed by dissolving in TOP.

Synthesis of 31, 45, and 78 nm CdSe/CdS Nanorods

To a flask containing TOPO (3 g), ODPA (0.29 g) and HPA (0.80 g) was added 0.090 g of CdO. After holding under vacuum for about 1 hour at 150° C., the solution was heated to 350° C. under argon, and TOP (1.5 g) was added with cooling. After raising the temperature to 350° C., a solution containing sulfur (0.120 g), TOP (1.5 g) and CdSe dots (200 µL, 400 µM) was quickly injected into the flask, where CdSe dots of a diameter of 3.3, 2.8, and 2.6 nm were injected to prepare nanorods with a length of 31, 45, and 78 nm, respectively (FIG. 4). The CdSe/CdS nanorods formed and grew for 8 minutes after injection of the CdSe dots.

Synthesis of Short Superparticles from CdSe/CdS Nanorods (Prior Art)

In a typical synthesis, DTAB (20.0 mg, 65.0 µmol) was dissolved in Nanopure water (1.0 mL) to form a solution. A chloroform solution of CdSe/CdS nanorods (5-30 mg/mL, 1 mL), with length of either 31, 45, or 78 nm, was thoroughly mixed with the DTAB solution by a vortex mixer, and chloroform was removed by bubbling Ar at 40° C. through the solution to form a clear, yellow nanorod-micelle aqueous solution. The nanorod-micelle aqueous solution was injected into a three-neck flask containing ethylene glycol (5.0 mL) with vigorous stirring. The mixture solution was further stirred at room temperature for 10 min and a Tween 20-SH or PEG-SH aqueous solution (0.1 mM, 1 mL) was injected into the flask. Under an Ar overgas, the mixture solution was heated to 80° C. at a rate of 10° C./min, held at 80° C. for 1 hour, and cooled to room temperature. Colloidal superparticles were separated by centrifugation (500 G, 15 minutes). The yellow precipitate was re-dispersed into ethanol and the superparticles were centrifuged and resuspended twice to purify the colloidal superparticles. The size of colloidal superparticles depended on the concentration of DTAB in the solution. (FIGS. 1 and 2) Synthesis of rice-shaped superparticles from CdSe/CdS nanorods In an exemplary synthesis, DTAB (20.0 mg, 65.0 µmol) was dissolved in Nanopure water (1.0 mL) to form a solution. Octylamine (0.1 µL) was added into a chloroform solution of 78 nm CdSe/CdS nanorods (20 mg/mL, 1 mL). The resulting mixture was thoroughly agitated with the DTAB solution using a vortex mixer. The chloroform was removed from the mixture by bubbling Ar through the solution at 40° C., resulting in a clear, yellow nanorod-micelle aqueous solution. This nanorod-micelle aqueous solution was injected into a three-neck flask containing ethylene glycol (5.0 mL) with vigorous stirring. The mixture was stirred at room temperature for an additional 10 minutes and a Tween 20-SH or PEG-SH aqueous solution (0.1 mM, 1 mL) was injected into the flask. The solution was heated to 80° C. at a rate of 10° C./min under an Ar atmosphere. After holding the temperature of the solution at 80° C. for 1 hour, the solution was cooled to room temperature. The resulting colloidal superparticles were separated by centrifuge (500 G, 15 min). The yellow precipitate was re-dispersed into ethanol and the superparticles were further purified twice by centrifugation. The resulting superparticles have a diameter of 200-500 nm and a length of 1.5-6 µm (FIG. 3).

Preparation of Aligned Superparticles Film

Method 1

A $Si_3N_4$ substrate (1.0 cm×2.0 cm) was patterned with microchannels of 2 µm in width separated by 2 µm, as shown in FIG. 12, and was cleaned by sonicating for 15 minutes in hexane, subsequently for 15 minutes in chloroform, and finally for 15 minutes in acetone. Afterwards, the patterned substrate was rinsed with ethanol and dried under a stream of argon. A 40-µL superparticles solution (2 mg/mL) was dropped on the cleaned and dried $Si_3N_4$ substrate oriented 45° from plane, while an air flow under a pressure of 4 pounds per square inch (psi) was passed from bottom to top parallel to the microchannels to force the superparticle solution droplet into the microchannels on the $Si_3N_4$ substrate, aligning the superparticles in the microchannels until the substrate surface appeared to be totally dried, as illustrated in FIG. 12. The substrate was rinsed with an ethanol solution and dried under an air flow three times. The ethanol solution contained 10-70% water or 10-50% tetraethyl orthosilicate (TEOS). The colloidal superparticles were aligned into nanorods assemblies in the channel of $Si_3N_4$ substrate as shown in the SEM image shown in FIG. 15A. TEOS (10 µL) was placed on the nanorods assemblies on the $Si_3N_4$ substrate, and dried under an air flow. The $Si_3N_4$ substrate was placed in a glass Petri dish (20 mL) and immersed in a PDMS solution (10 mL) and kept under vacuum for 10 minutes to degas the PDMS fluid prior to curing. The PDMS was cured with a crosslinking agent such as methyltrichlorosilane at 100° C. for one hour to form a transparent polymer film. After cooling to room temperature, the PDMS film was delaminated from the $Si_3N_4$ substrate to yield a PDMS film with embedded nanorods assemblies. SEM images of the $Si_3N_4$ substrate indicated that the nanorods assemblies were successfully transferred into the PDMS substrate, where SEM images show the microchannels pattern of the $Si_3N_4$ substrate, but individual rice-shaped colloidal superparticles are not observed, as can be seen in FIG. 15B. The CdSe/CdS nanorods assemblies in this PDMS substrate are clearly observed by fluorescence microscopy as shown in FIG. 15C. The resulting PDMS thin film having the CdSe/CdS nanorods assemblies exhibits strong linearly polarized emission with a polarization ratio of 0.88 FIG. 15D.

Method 2

A $Si_3N_4$ substrate (1.0 cm×2.0 cm) with microchannels (2 µm in width and 2 µm in gap between neighboring channels) was cleaned and dried as indicated in Method 1, above. As shown in FIG. 13, The $Si_3N_4$ substrate was placed in a glass Petri dish (20 mL) and immersed in a PDMS solution (10 mL) under vacuum for 10 minutes. The PDMS was cured at 100° C. for 1 hour to give a transparent polymer film. After cooling to room temperature, the PDMS film with microchannels was peeled from the $Si_3N_4$ substrate template. A 40-µL superparticles solution (2 mg/mL), in ethanol containing 10-70% water or 10-50% TEOS, was drop on the resulting PDMS thin film oriented 45° from plane, while an air flow under a pressure of 4 pounds per square inch (psi) was passed from bottom to top parallel to the microchannels of the PDMS thin film, forcing the superparticle solution droplet into the microchannels on the PDMS thin film while aligning the superparticles with the microchannels, and to dry the PDMS thin film. The PDMS film was washed three times with ethanol and dried under an air flow.

Method 3

A roller with microchannels of 2 μm width was fabricated, and rice-shaped superparticles were aligned inside the microchannels on the roller with air-flow assistance, as shown in FIG. 14, in the manner similar to Methods 1 and 2, above, where the solution of superparticles was either pure ethanol, ethanol solution containing 10-70% water, or ethanol solution containing 10-50% TEOS. The aligned rice-shaped superparticles were transferred to a flat substrate via rotating the roller on the flat substrate.

Down-Conversion LED

Figure 16:
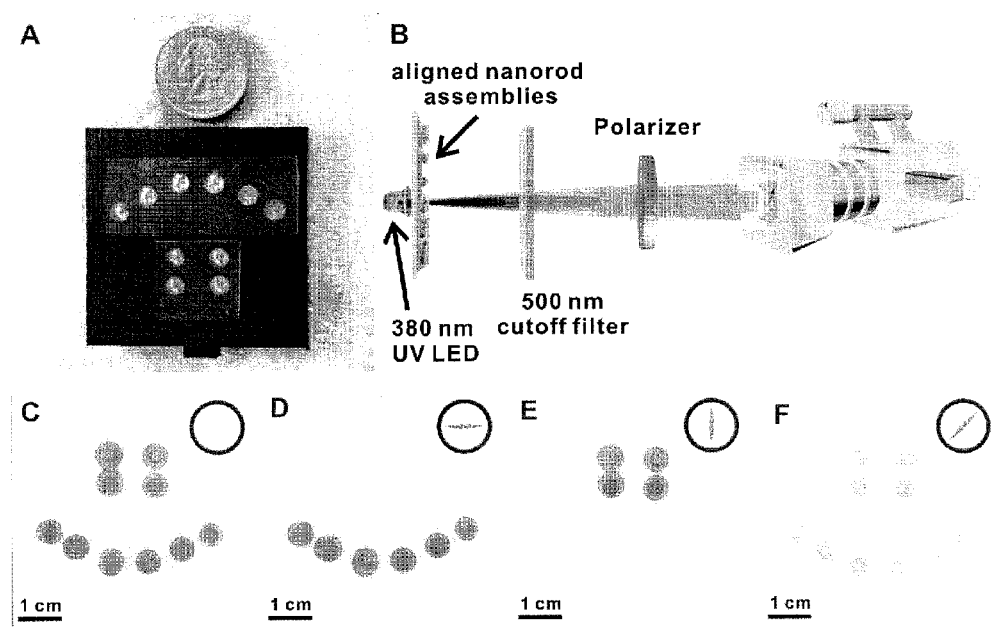
FIG. 16 shows (A) a polarized down-conversion LED, according to an embodiment of the invention, constructed with PDMS thin films with embedded CdSe/CdS nanorods assemblies of aligned colloidal superparticles and 10 GaN LEDs that emit 380 nm light where four GaN LED lights in the corners of a square covered with PDMS thin film aligned in one orientation and six in a curved line covered with a PDMS thin film aligned in a perpendicular orientation is included (B) with a cutoff filter and polarizer inserted before a camera, used as a detection device to observe the polarized light emitted, such that the optical image has all ten LEDs emitting orange lights (580 nm) in the absence of a polarizer (C), but where (D) a polarizer is inserted with one orientation, six LEDs are bright and four are dim, and (E) when the polarizer is turned 90 degrees, four LEDs are bright and six are dim, and (F) when the polarizer is 45 degrees to all aligned superparticles, the light intensity is approximate half for all LEDs.

The transparent nanorods assemblies containing PDMS film were used to build an energy down-conversion LED display, where a panel of 14 GaN LEDs (emitting at 380 nm) were covered by two adjacent superparticle assemblies containing PDMS films, as shown in FIG. 16A. The down-conversion LED display emits linearly polarized orange light ($?_{mission}$=590 nm) with a polarization ratio of 0.88, a ratio that is slightly higher than the polarization ratio of a single CdSe/CdS nanorod, demonstrating that CdSe/CdS superparticle assemblies are nearly perfectly aligned into a single lateral direction in the PDMS thin film. The panel has ten LED lights in the middle of the panel. The ten LEDs were covered with two PDMS thin films containing laterally aligned superparticle assemblies with one orientation for the four assemblies residing at the corners of a square, and six assemblies residing in a curved line, where the orientation is perpendicular to the assemblies residing at the corners of the square, as shown in FIG. 16A. As shown in FIG. 16B a 500 nm cutoff filter is inserted as desired between the superparticle assemblies and an optical image, FIG. 16C, shows that all ten LEDs emitted orange light when passing through the nanorods assemblies containing PDMS films, as recorded by a camera, as shown in FIG. 16B. By including a polarizer, the LEDs covered with PDMS films having superparticle assemblies aligned perpendicular to the polarizer dim significantly, as shown in FIG. 16D but not the LEDs covered with film with nanorods assemblies aligned with the polarizer. Where the polarizer was turned 90 degrees, the previously dimmed superparticle assemblies are bright and the previously lit superparticle assemblies are dimmed, as shown in FIG. 16E. When the polarizer is 45 degrees to both superparticle assemblies, the intensity of the light leaving the polarizer is lowered from all 10 superparticle assemblies, as shown in FIG. 16F. The polarization ratio of the lights from these LEDs is about 0.88, which is consistent with the results from the fluorescence measurements indicated above.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

We claim:

1. A rice-shaped colloidal superparticle, comprising a plurality of nanorods having a long axis in excess of about three microns and a length to diameter ratio in excess of about three to about ten,
    wherein said colloidal superparticles are aligned along the long axis of said rice-shape to form a nanorods assembly, wherein said colloidal superparticles comprise a multiplicity of nanorods aligned along the long axes of said rice-shaped colloidal superparticles, wherein an average of said long axes of said colloidal superparticle is in excess of 3 microns, wherein the length of said nanorods assembly is in excess of about 50 microns and the diameter perpendicular to said length of said nanorods assembly is less than said average of said long axes of said colloidal superparticles, and wherein a polarization ratio of said nanorods assembly is equal to or greater than a polarization ratio of nanorods in said colloidal superparticles, and
    wherein said nanorods comprise CdSe/CdS, CdSe:Te/CdS, Mn-doped CdSe/CdS, Au, Cu, Fe, Co, Ni, indium oxide, gallium oxide, CdSe, CdS, CdTe, ZnS, ZnSe, ZnTe, HgS, HgSe, HgTe, InP, InAs, GaP, GaAs, PbS, PbSe, PbTe, InCuS, InCuSe, InAgS, InAgSe, InAgTe, or any combination thereof.

2. The rice-shaped colloidal superparticle of claim 1, wherein said nanorods comprise CdSe/CdS.

3. A polarizing photonic sheet, comprising a plurality of said nanorods assemblies of claim 2 embedded within or resting upon a substrate.

4. The polarizing photonic sheet of claim 3, wherein said substrate comprises an inorganic or organic conductor, semiconductor, or insulator.

5. The polarizing photonic sheet of claim 3, wherein said substrate comprises a polymer.

6. A down-conversion device, comprising at least one polarizing photonic sheet of claim 3, at least one light emitting diode (LED), and at least one polarizer.

7. A method of preparation of the rice-shaped colloidal superparticle of claim 1, comprising:
    providing a first solution comprising at least one first solvent and a multiplicity of nanorods comprising an inorganic material and at least one ligand;
    adding an additional ligand to said first solution to form a second solution;
    combining said second solution with a first aqueous solution of a surfactant to form a third solution;
    removing a portion of said first solvent from said third solution to form a second aqueous solution; and
    injecting said second aqueous solution into a water miscible solvent, wherein colloidal superparticles are formed in an aqueous suspension.

8. The method of claim 7, wherein said additional ligand comprises one or more $C_3$-$C_{20}$: primary alkyl amines, one or more $C_3$-$C_{20}$: secondary alkyl amines, and/or one or more $C_3$-$C_{20}$: tertiary alkyl amines.

9. The method of claim 7, wherein said additional ligand comprises one or more bidentate ligand comprising one or more $C_{10}$-$C_{20}$ alkane that is α,ω disubstituted with an amine, thiol, alcohol, carboxylic acid, sulfonic acid, or phosphonic acid.

10. The method of claim 7, further comprising injection of a water soluble ligand to said aqueous suspension.

11. The method of claim 7, further comprising isolating said colloidal superparticles from said aqueous suspension.

12. The method of claim 11, wherein said isolating comprises centrifugation.

13. A method of preparing a nanorods assembly, comprising:
    providing a suspension comprising a multiplicity of rice-shaped colloidal superparticles of claim 1 in a liquid;
    depositing said suspension on the surface of a substrate comprising at least one microchannel;
    infiltrating of said rice-shaped colloidal superparticles into said microchannels; and removing a portion of said liquid from said surface; wherein said rice-shaped colloidal superparticles are contacting each other and aligned with said rice-shaped colloidal superparticles' long axes to form a nanorods assembly within said microchannels of said substrate.

14. The method of claim 13, wherein infiltrating comprises promoting a fluid flow on said surface of said substrate.

15. The method of claim 13, further comprising:
placing a fluid on the surface of said nanorods assembly within said microchannels of said substrate;
converting said fluid into a solid material; and
separating said solid material from said surface of said substrate, wherein said nanorods assemblies are imbedded within the solid material.

16. The method of claim 15, wherein said fluid is a polymerizable or cross-linkable material and wherein said converting comprises polymerization or cross-linking.

17. The method of claim 15, wherein said fluid is a melt and wherein said solid material is the solidified glass and/or crystal from said melt.

18. The method of claim 15, wherein said separating comprises delaminating said solid material with said imbedded nanorods assemblies from said surface of said substrate or dissolving or decomposing said substrate.

19. The method of claim 13, further comprising:
conforming said substrate with said nanorods within said microchannels as a cylinder, with said microchannels situated on the outside of said cylinder, and
rolling said cylinder upon a second surface, wherein said nanorods assemblies are transferred to said second surface.

* * * * *

UNITED STATES PATENT AND TRADEMARK OFFICE
CERTIFICATE OF CORRECTION

PATENT NO. : 9,291,758 B2
APPLICATION NO. : 14/107148
DATED : March 22, 2016
INVENTOR(S) : Yunwei Charles Cao et al.

It is certified that error appears in the above-identified patent and that said Letters Patent is hereby corrected as shown below:

IN THE SPECIFICATION

Column 1
Line 15 "award by" should read --awarded by--.

Signed and Sealed this
Seventh Day of June, 2016

Michelle K. Lee
*Director of the United States Patent and Trademark Office*